(12) United States Patent
Descure

(10) Patent No.: US 8,878,418 B2
(45) Date of Patent: Nov. 4, 2014

(54) THERMOELECTRIC GENERATOR

(75) Inventor: Pierrick Descure, Saint-Ismier (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 977 days.

(21) Appl. No.: 12/902,565

(22) Filed: Oct. 12, 2010

(65) Prior Publication Data

US 2011/0083714 A1  Apr. 14, 2011

(30) Foreign Application Priority Data

Oct. 12, 2009 (FR) ...................... 09 57106

(51) Int. Cl.
*H02N 2/18* (2006.01)
(52) U.S. Cl.
CPC ...................... *H02N 2/18* (2013.01)
USPC ........... 310/306; 310/311; 310/307; 310/324; 310/339
(58) Field of Classification Search
USPC ........... 310/311, 306, 307, 339, 324; 136/239
IPC ....................................................... H02N 2/00
See application file for complete search history.

(56) References Cited

U.S. PATENT DOCUMENTS

| 4,053,859 | A | 10/1977 | Hollweck | |
|---|---|---|---|---|
| 5,014,036 | A | 5/1991 | Komoto | |
| 8,492,958 | B2 * | 7/2013 | Skotnicki | 310/307 |
| 2003/0122448 | A1 * | 7/2003 | Kim et al. | 310/311 |
| 2004/0150298 | A1 * | 8/2004 | Styblo et al. | 310/339 |
| 2005/0093398 | A1 * | 5/2005 | Kim et al. | 310/324 |

OTHER PUBLICATIONS

French Search Report dated Apr. 19, 2010 from corresponding French Application No. 09/57106.

* cited by examiner

*Primary Examiner* — Thomas Dougherty
*Assistant Examiner* — Karen B Addison
(74) *Attorney, Agent, or Firm* — Allen, Dyer, Doppelt, Milbrath & Gilchrist, P.A.

(57) ABSTRACT

A thermoelectric generator including a membrane maintained by lateral ends and capable of taking a first shape when its temperature reaches a first threshold and a second shape when its temperature reaches a second threshold greater than the first threshold; and mechanism capable of converting the motions and the deformations of the membrane into electricity.

31 Claims, 5 Drawing Sheets

THERMOELECTRIC GENERATOR

CROSS REFERENCE TO RELATED APPLICATIONS

This application claims the priority benefit of French patent application Ser. No. 09/57106, filed on Oct. 12, 2009, entitled "THERMOELECTRIC GENERATOR," which is hereby incorporated by reference to the maximum extent allowable by law.

BACKGROUND OF THE INVENTION

1. Field of the Invention

The present invention relates to a thermoelectric generator, that is, a device capable of generating electricity from a heat source. It especially aims at the exploitation of the thermal power generated by certain types of equipment, for example, electronic boxes or car mufflers.

2. Discussion of the Related Art

In certain mobile devices, for example, telephones, watches, or pacemakers, piezoelectric microgenerators have been used to generate electricity from the mechanical vibrations resulting from the user's movements. This enables to at least partially recharge the device batteries. A disadvantage of such a solution is that it cannot be used in the case of fixed equipment, for example, a television set.

Devices capable of directly converting heat into electricity by the Seebeck effect have also been provided. It has indeed been observed that a potential difference appears at the junction of two conductive materials submitted to a temperature difference. However, such devices have a very low efficiency. In practice, the use of the Seebeck effect is mainly limited to temperature measurement applications.

SUMMARY OF THE INVENTION

Thus, an object of an embodiment of the present invention is to provide a thermoelectric generator overcoming at least some of the disadvantages of prior art solutions.

An object of an embodiment of the present invention is to provide such a generator having a high efficiency.

An object of an embodiment of the present invention is to provide such a generator which is easy to manufacture.

An object of an embodiment of the present invention is to provide such a generator which is easy to integrate in conventional equipment.

Thus, an embodiment of the present invention provides a thermoelectric generator comprising: a membrane maintained by lateral ends and capable of taking a first shape when its temperature reaches a first threshold and a second shape when its temperature reaches a second threshold greater than the first threshold; and means capable of converting the motions and the deformations of the membrane into electricity.

According to an embodiment of the present invention, the conversion means comprise a region made of a piezoelectric material connected to output terminals of the generator.

According to an embodiment of the present invention, the membrane, in its first shape, is capable of being in contact with a hot wall and, in its second shape, is capable of being in contact with a cold wall.

According to an embodiment of the present invention, the generator further comprises a package comprising first and second superposed portions delimiting a cavity, the membrane being arranged in the cavity and attached to the package by its lateral ends, wherein the membrane, in its first shape, comes in contact with the first portion of the package and, in its second shape, comes in contact with the second portion of the package.

According to an embodiment of the present invention, the membrane, in its first shape, takes the shape of the inner surface of the first portion of the package and, in its second shape, takes the shape of the inner portion of the second portion of the package.

According to an embodiment of the present invention, the membrane comprises a bimetallic support strip bearing against lateral ends on springs.

According to an embodiment of the present invention, the membrane comprises a support layer made of a shape-memory material.

According to an embodiment of the present invention, the shape-memory material is a nickel and titanium alloy.

According to an embodiment of the present invention, said region of a piezoelectric material has the shape of a piezoelectric layer deposited on the membrane.

According to an embodiment of the present invention, the membrane comprises, superposed in the following order, a layer of a material having a first thermal expansion coefficient, and a layer of a material having a second thermal expansion coefficient much greater than the first coefficient, the piezoelectric layer being deposited on the layer having the second coefficient.

According to an embodiment of the present invention, the thickness of the layer of a material having a first thermal expansion coefficient is greater than the thickness of the piezoelectric layer.

According to an embodiment of the present invention, the first thermal expansion coefficient is smaller than that of the piezoelectric material.

According to an embodiment of the present invention, the generator is capable of being assembled on an integrated circuit chip.

According to an embodiment of the present invention, the generator is capable of being assembled on a hot surface of a car such as a car muffler or a braking device.

According to an embodiment of the present invention, the generator is capable of being assembled in a battery charger operating from a heat source such as a heater or a cooking plate.

The foregoing objects, features, and advantages of the present invention will be discussed in detail in the following non-limiting description of specific embodiments in connection with the accompanying drawings.

DETAILED DESCRIPTION

Figure 1:
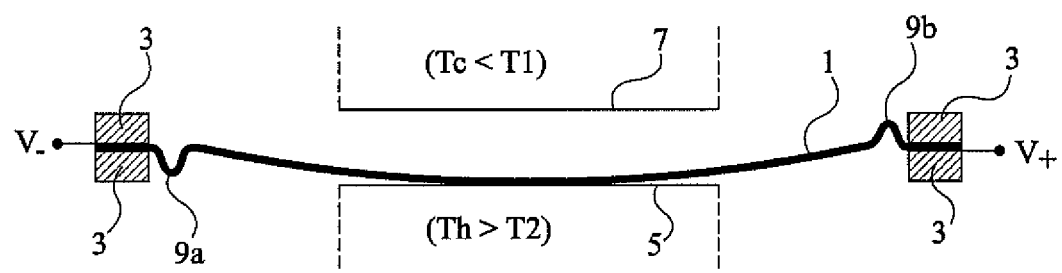
FIG. 1 is a simplified cross-section view of an embodiment of a thermoelectric generator.

For clarity, the same elements have been designated with the same reference numerals in the different drawings and, further, the various drawings are not to scale.

An aspect of an embodiment of the present invention is to provide a device capable of:
  converting thermal power into mechanical power by means of a membrane mobile between two positions provided to change shape when its temperature varies; and
  converting the mechanical power generated by the membrane into electric power.

FIG. 1 is a simplified cross-section view of an embodiment of a thermoelectric generator. This generator comprises a membrane 1 attached by its lateral ends to a support 3. In this example, membrane 1 has, in top view, a rectangular shape with a length on the order of a few centimeters and a width of a few centimeters. However, the membrane may have any shape or size. As an example, the membrane may have a circular shape, support 3 then being ring-shaped.

Membrane 1 is provided to alternate between two shapes when its temperature varies. In its first shape, membrane 1 is bent downwards, as shown in FIG. 1. This first shape corresponds to an idle state, taken by the membrane when its temperature is lower than a first threshold T1. In its second shape, the membrane is bent upwards. As an example, the second shape may be substantially symmetrical to the first shape with respect to the horizontal plane of symmetry of support 3. The second shape is taken by the membrane when its temperature is greater than a second threshold T2 greater than or equal to T1. A membrane operating according to a hysteresis cycle is here considered, that is, second threshold T2 is greater than first threshold T1.

Membrane 1 may comprise a support layer made of a shape-memory material, for example, a nickel and titanium alloy. Such a material comprises two crystal phases and is capable of having two stable positions according to its temperature.

According to another embodiment, membrane 1 may comprise a bimetallic strip formed of two superposed layers of different metals having different thermal expansion coefficients. Due to the difference between thermal expansion coefficient, such a strip bends in a first direction or in a second direction when its temperature varies. However, conversely to the case of a shape-memory material, the deformation of a bimetallic strip is progressive, and not abrupt. Thus, to impose two shapes to the membrane, as described hereabove, and a fast transition from one shape to the other, springs 9a, 9b, schematized in FIG. 1 by the torsion of the lateral ends of the membrane, are provided.

It is provided to arrange membrane 1 between two opposite walls 5 and 7. Lower wall 5 is a hot wall, for example a metal wall of a car muffler or of car brakes, a package of an integrated circuit chip, or any other hot surface of an integrated circuit chip or another electronic circuit. Upper wall 7 is a cold wall, that is, its temperature is substantially lower than that of the hot wall. It may be a radiator, an external casing of an electronic device, or simply ambient air. The arrangement is selected so that the membrane comes, in its first shape, in contact with hot wall 5, and in its second shape, in contact with cold wall 7.

Figure 2:
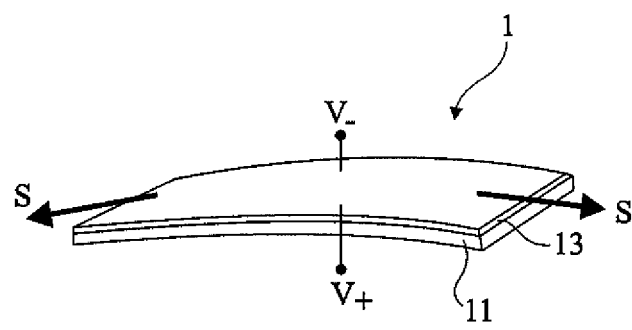
FIG. 2 is a simplified perspective view of a mobile membrane comprised in the thermoelectric generator of FIG. 1.

FIG. 2 is a simplified perspective view of a portion of membrane 1 of FIG. 1. As described hereabove, membrane 1 comprises a support layer 11 capable of alternating between two shapes according to its temperature. At the surface of support 11, a layer 13 of a piezoelectric material is provided. When the temperature varies, the shape changes of support 11 and the phenomena of thermal expansion/compression of support 11 create mechanical stress in piezoelectric layer 13. Such stress, shown in the drawings by arrows S, are mainly exerted along directions tangent to the membrane. In this example, the piezoelectric material is pre-biased so that the electric field created in the material is orthogonal (perpendicular to the membrane surface) to stress S (tangential to the membrane surface) exerted on the material. This generates a potential difference $V_+ - V_-$ between the upper surface and the lower surface of piezoelectric layer 13.

It is provided to form contact terminals connected to the upper and lower surfaces of the piezoelectric layer. For this purpose, an upper metal electrode (not shown) arranged at the surface of piezoelectric layer 13 may for example be provided. Support layer 11 of the membrane being metallic, it may be used as a lower electrode. It may then be provided to form output terminals of the generator, connected to the lower and upper electrodes at the level of the non-mobile ends of the membrane, as shown in FIG. 1.

Figure 3:
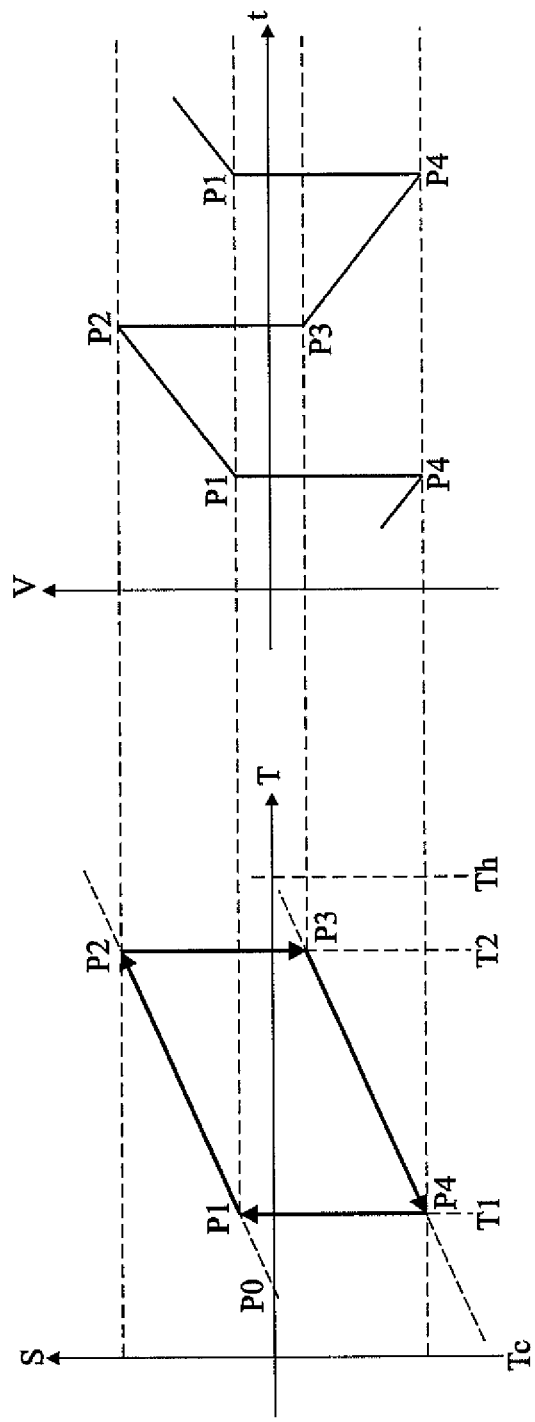
FIG. 3 is a diagram schematically illustrating the operating principle of the thermoelectric generator described in relation with FIGS. 1 and 2.

FIG. 3 is a diagram schematically illustrating the operating principle of the thermoelectric generator described in relation with FIGS. 1 and 2. The left-hand portion of the diagram illustrates the variation of mechanical stress S in the piezoelectric layer according to temperature T of the membrane. The right-hand portion of the diagram illustrates the variation of voltage V at the output terminals of the generator along time.

In an initial phase P0, the heat source is not established and the membrane temperature is lower than T1. The membrane then is in its first shape, in contact with the hot wall (in this case, cold) of the generator. When the system starts heating up, the temperature of the membrane, in contact with the hot wall, increases progressively.

A steady operating state is considered hereafter, that is, where the hot and cold walls of the thermoelectric generator are at substantially constant temperatures, respectively Th and Tc, with Tc<T1<T2<Th. The generator then periodically follows a cycle P1-P2-P3-P4.

At point P1, the membrane temperature is equal to the first threshold, T1, and the membrane is in its first shape, in contact with the hot wall. The membrane temperature progressively increases, between points P1 and P2. This results in a progressive variation of the stress in the piezoelectric material, due to the expansion of the metal support layer of the membrane. This causes a progressive variation of the output voltage of the generator.

At point P2, the membrane temperature reaches the second threshold, T2, at which its shape changes. The membrane then abruptly takes its second shape and comes into contact with the cold wall of the generator. This results in an abrupt variation of the mechanical stress in the piezoelectric layer, causing an abrupt variation of the voltage at the output terminals of the generator.

Then, from point P3, the temperature of the membrane, in contact with the cold wall, progressively decreases, thus causing a progressive variation of the stress in the piezoelectric material. This results in a progressive variation of the voltage at the output terminals of the generator.

At point P4, the membrane temperature reaches the first threshold, T1, at which its shape changes. The membrane then abruptly recovers its first shape and comes into contact with the hot wall of the generator. This results in an abrupt variation of the stress in the piezoelectric layer, causing an abrupt variation of the voltage at the output terminals of the generator. The cycle then resumes from phase P1.

Thus, the thermal power of the hot wall is transferred by the membrane to the cold wall by increments. This transfer causes displacements of the membrane and phenomena of expansion/compression of the membrane. The mechanical power associated with such phenomena is partially converted into electric power.

An advantage of the provided system is that it enables to use not only the mechanical stress linked to the shape changes of the membrane but also the mechanical stress linked to the expansion/compression of the membrane to actuate the piezoelectric material.

To optimize the efficiency of the generator, it is desirable for temperature difference Th−Tc between the hot and cold walls to be maximum. It is also preferable for the temperature difference between thresholds T1 and T2 at which the membrane changes shape to be large. As an example, if temperatures Th and Tc of the hot and cold walls respectively are 80 and 30° C., a membrane with respective shape change thresholds T1 and T2 at 40 and 70° C. may be provided.

To improve the thermal contact between the membrane and the hot and cold walls, an oil film or a thermally-conductive paste may if necessary be provided on each of the walls. Further, it is preferable for the membrane to have a low heat capacity to promote the frequency of heat transfers between the hot wall and the cold wall.

Further, at least one material having a large thermal expansion coefficient will preferably be selected to form the membrane support layer.

Further, the mass of the membrane (support layer+piezoelectric layer) should be sufficiently low to avoid slowing down or disturbing the displacements of the membrane. As an example, the thickness of the metal support layer may approximately range from 0.5 to 1 mm and that of the piezoelectric layer may range from 0.1 to 0.2 mm.

Figure 4:
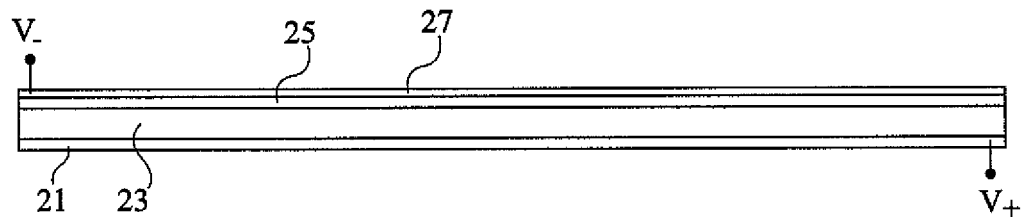
FIG. 4 is a simplified cross-section view of an example of a mobile membrane comprised in a thermoelectric generator.

FIG. 4 is a simplified cross-section view of an embodiment of a membrane mobile between two positions of a thermoelectric generator of the type described in relation with FIGS. 1 to 3. In this example, the membrane comprises a bimetallic support comprising a lower layer 21 of a first metal having a very low expansion coefficient, for example, Invar, and an upper layer 23 of a second metal having a high thermal expansion coefficient. The second metal may be a shape-memory material with a high thermal expansion coefficient, for example a nickel and titanium alloy. If the second metal is not a shape-memory material, lateral springs capable of ensuring the hysteresis-type behavior of the thermal cycle may be provided. At the surface of the bimetallic support, on the side opposite to the layer of low expansion coefficient, a piezoelectric layer 25 is provided. In this example, the piezoelectric layer is covered with a metal electrode 27 capable of being connected to an output terminal V_ of the generator. Output terminal V_+ may be directly connected to bimetallic support 21, 23.

According to an advantage of this embodiment, the positioning of the piezoelectric layer on the side of the bimetallic support opposite to invariant layer 21, enables to amplify, in the piezoelectric layer, the mechanical stress linked to phenomena of expansion/compression of the metal support.

In the case where layer 23 is made of a shape-memory material, when the temperature increases, layer 23 tends to expand and especially to lengthen. Due to its low thermal expansion coefficient, the piezoelectric layer tends to lengthen less than support layer 23. Thus, in the absence of invariant layer 21, the membrane tends to progressively bend during the progressive temperature increase phase. This bending promotes a decrease of the stress exerted in the piezoelectric material since it tends to restrict the elongation (forced by the support layer) of the piezoelectric layer. The presence of invariant layer 21 of a thickness greater than that of the piezoelectric layer and possibly having a thermal expansion coefficient substantially smaller than that of the piezoelectric material prevents this bending phenomenon and, conversely, tends to cause a bending of opposite direction, which significantly amplifies the stress exerted in the piezoelectric layer.

In the case where invariant layer 21 and layer 23 form a conventional bimetallic support (with no shape memory), forced in high or low position by springs, when the temperature increases, the bimetallic support tends to bend. The piezoelectric layer having a low thermal expansion coefficient, if it were placed on the side of invariant layer 21, would tend to enhance the bending of the support. This would result in restricting the elongation (forced by the expansion of the support) of the piezoelectric layer, and thus to decrease the stress exerted in the piezoelectric material. The positioning of the piezoelectric layer on the side opposite to the invariant layer prevents this bending phenomenon and, conversely, tends to cause a bending of opposite direction. This causes a significantly amplification of the stress exerted in the piezoelectric layer.

Simulations carried out by the present inventors show that the embodiment described in relation with FIG. 4 provides an efficiency of conversion of thermal power into electric power on the order of 15%.

Figure 5A:
FIGS. 5a and 5b are simplified cross-section views illustrating alternative embodiments of a portion of the membrane of FIG. 4.

FIG. 5a is a simplified cross-section view of a piezoelectric layer 31 of a thermoelectric generator of the above-described type, and of its connection to output terminals $V_+$ and $V_-$ by metal electrodes. In this drawing, for clarity, the vertical dimensions are especially enlarged with respect to the horizontal dimensions.

Figure 5B:
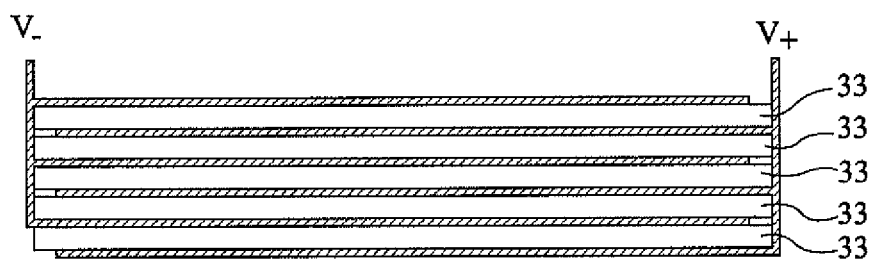

FIG. 5b is a simplified cross-section view of an alternative embodiment of a piezoelectric layer of a thermoelectric generator of the type described hereabove, and of its connection to output terminals $V_-$ and $V_+$. In this drawing, for clarity, the vertical dimensions are especially enlarged with respect to the horizontal dimensions. In this variation, instead of a thick piezoelectric layer, a plurality of thin superposed piezoelectric layers 33 are provided. Metal electrodes, preferably very thin, alternately connect the front and rear surfaces of piezoelectric layers 33 to output terminals $V_+$ and $V_-$.

It should be noted that the voltage generated between the front and rear surfaces of a piezoelectric layer is related to the thickness of this layer. Thus, in the single-layer variation of FIG. 5a, the thick piezoelectric layer generates a specifically high voltage. An advantage of the multiple-layer variation of FIG. 5b is that it enables providing the same electric power as with a single-layer structure, but at a voltage which is n times smaller, n being the number of thin layers 33, the sum of the thicknesses of layers 33 (FIG. 5b) being equal to the thickness of layer 31 (FIG. 5a).

Figure 6:
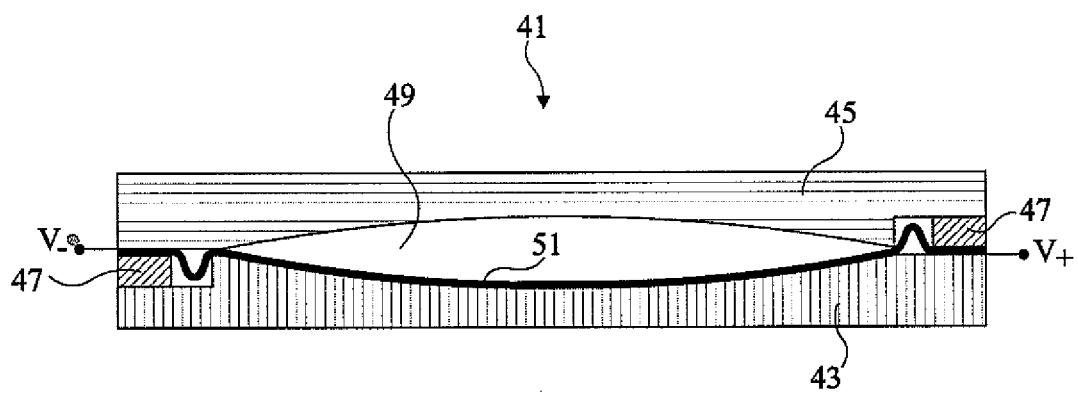
FIG. 6 is a simplified cross-section view of an alternative embodiment of a thermoelectric generator.
Figure 7:
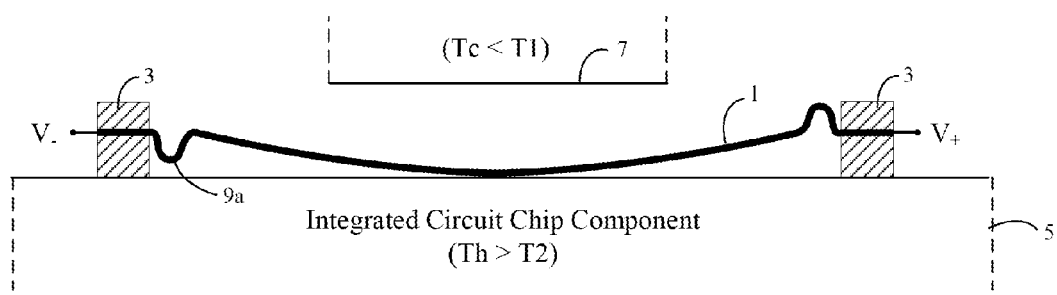
FIG. 7 is a simplified cross-section view of an embodiment of a thermoelectric generator in which the generator is assembled on an integrated circuit.
Figure 8:
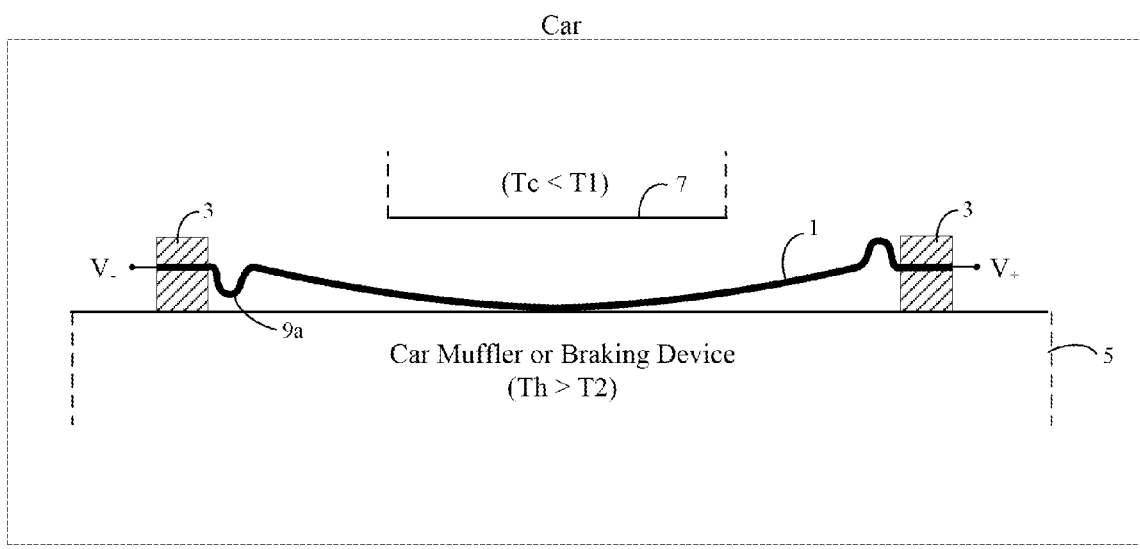
FIG. 8 is a simplified cross-section view of an embodiment of a thermoelectric generator in which the generator is assembled on a car muffler or car braking device within a car.
Figure 9:
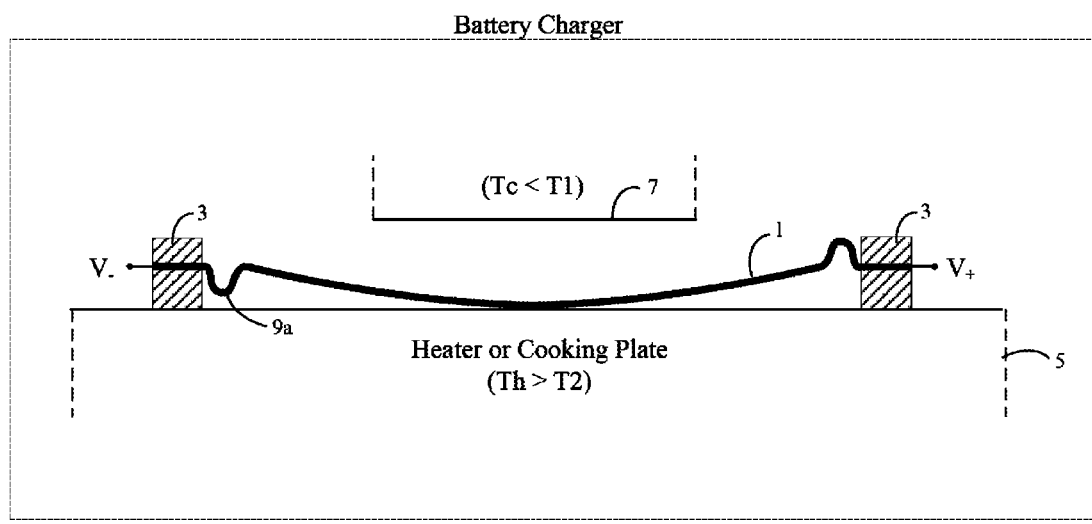
FIG. 9 is a simplified cross-section view of an embodiment of a thermoelectric generator in which the generator is assembled on a heater or cooking plate within a battery charger.

FIG. 6 is a simplified cross-section view of an alternative embodiment of a thermoelectric generator. Generator 41 comprises a package for example having, in top view, a rectangular shape. The package comprises a lower portion 43 capable of being put in contact with a heat source, and an upper portion 45 superposed to the lower portion and capable of being put in contact with a cold source. Portions 43 and 45 are preferably thermally conductive, and are separated from each other by a thermally-insulating material 47. Portions 43 and 45 of the package delimit a cavity 49. In this example, the lower surfaces of portions 43 and 45 of the package are basin-shaped. In cavity 45, a membrane 51 mobile between two positions, for example, of the type described in relation with FIG. 4, is provided. Membrane 51 is attached to the package by its lateral ends. According to an aspect of the present embodiment, in its first shape, the membrane takes the shape of the inner surface of hot portion 43 of the package, and in its second shape, that of the inner surface of cold portion 45 of the package.

An advantage of this embodiment is that it provide a good thermal contact between the membrane and the hot and cold sources.

Further, such a package is easy to integrate in any device comprising a heat source.

Specific embodiments of the present invention have been described. Different variations and modifications will occur to those skilled in the art.

In particular, a thermoelectric generator in which a mobile membrane actuates a piezoelectric element having the shape of a piezoelectric layer directly deposited on the membrane has been described. Other arrangements of the piezoelectric element may be provided, for example, blocks of piezoelectric material on which are bearing the lateral ends of the membrane so that at each shape change, the membrane exerts a pressure on these blocks.

More generally, it will be within the abilities of those skilled in the art to provide other means capable of converting the mechanical power of the mobile membrane into electric power.

Further, the present invention is not limited to the use of the above-mentioned heat sources to operate the thermoelectric generator. According to an alternative embodiment, not shown, the cold wall directly is the rear surface of the substrate of an integrated circuit chip. In this variation, in its first shape, the membrane takes the shape of the rear surface of the substrate.

Similarly, a thermoelectric generator capable of recharging batteries, for example, lithium-ion batteries, from a heat source such as a radiator or a cooking plate, may be provided.

Further, the present invention is not limited to the above-described means of connection of the piezoelectric element to the output terminals of the generator. It will be within the abilities of those skilled in the art to use any adapted connection means.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A thermoelectric generator comprising:
   a membrane maintained by lateral ends and capable of taking a first shape when its temperature reaches a first threshold and a second shape when its temperature reaches a second threshold greater than the first threshold; and
   a layer of a piezoelectric material deposited on the membrane and connected to output terminals of the generator, the layer adapted to convert deformations of the membrane as the membrane deforms between the first shape and the second shape into electricity, wherein the membrane is capable of taking the first shape and/or the second shape as a result of thermal expansion and/or thermal compression of at least a portion of the membrane.

2. The generator of claim 1, wherein the membrane, in its first shape, is capable of being in contact with a hot wall and, in its second shape, is capable of being in contact with a cold wall.

3. The generator of claim 2, wherein the membrane, in its first shape, is heated directly by the hot wall, and in its second shape, is cooled directly by the cold wall.

4. The generator of claim 1, further comprising a package comprising first and second superposed portions delimiting a cavity, the membrane being arranged in the cavity and attached to the package by said lateral ends, wherein the membrane, in its first shape, comes in contact with the first portion of the package and, in its second shape, comes in contact with the second portion of the package.

5. The generator of claim 4, wherein the membrane, in its first shape, takes the shape of the inner surface of the first portion of the package and, in its second shape, takes the shape of the inner portion of the second portion of the package.

6. The generator of claim 1, wherein the membrane comprises a bimetallic support strip bearing against lateral ends on springs.

7. The generator of claim 1, wherein the membrane comprises a support layer made of a shape-memory material.

8. The generator of claim 7, wherein the shape-memory material is a nickel and titanium alloy.

9. The generator of claim 1, adapted to be assembled on an integrated circuit chip.

10. The generator of claim 1, adapted to be assembled on a hot surface of a car.

11. The generator of claim 10, wherein the hot surface of a car is a car muffler.

12. The generator of claim 10, wherein the hot surface of a car is a braking device.

13. The generator of claim 1, adapted to be assembled in a battery charger operating from a heat source.

14. The generator of claim 13, wherein the heat source is a heater.

15. The generator of claim 13, wherein the heat source is a cooking plate.

16. The generator of claim 1, wherein the membrane comprises a layer of a material having a first thermal expansion coefficient and a layer of a material having a second thermal expansion coefficient greater than the first thermal expansion coefficient.

17. The generator of claim 16, wherein the membrane comprises, superposed in the following order, a layer of a material having a first thermal expansion coefficient, a layer of a material having a second thermal expansion coefficient greater than the first thermal expansion coefficient, and the piezoelectric layer.

18. The generator of claim 17, wherein a thickness of the layer of the material having a first thermal expansion coefficient is greater than a thickness of the piezoelectric layer.

19. The generator of claim 17, wherein the first thermal expansion coefficient is smaller than that of a thermal expansion coefficient of the piezoelectric material.

20. A method of converting thermal energy into electrical energy comprising:
   providing a device having a membrane capable of taking a first shape when the temperature of the membrane reaches a first threshold and a second shape when the temperature of the membrane reaches a second threshold, wherein the membrane comprises of a layer of piezoelectric material connected to output terminals of a generator;

exposing the membrane, when in the first shape, to a hot environment to directly heat the membrane to a first threshold, causing thermal expansion of the membrane until which causes the membrane to undergo a shape change into the second position, the piezoelectric layer converting the membrane expansion and shape change into electric energy; and exposing the membrane, when in the second shape, to a cold environment to directly cool the membrane to a second threshold, causing thermal compression of the membrane which causes the membrane to undergo a shape change into the first position, the piezoelectric layer converting the membrane compression and shape change into electric energy.

21. The method of claim 20, wherein exposing the membrane to a hot environment and exposing the membrane to a cold environment are repeated continuously.

22. The method of claim 20, wherein providing a device having a membrane capable of taking a first shape when the temperature of the membrane reaches a first threshold and a second shape when its temperature reaches a second threshold, further comprises providing the device having a membrane comprising a bimetallic support comprising a first layer of material having a first thermal expansion coefficient and a second layer of material having a second thermal expansion coefficient greater than the first thermal expansion coefficient.

23. The method of claim 22, further comprising amplifying mechanical stress in the piezoelectric layer caused by deformations of the membrane.

24. The method of claim 23, wherein amplifying the mechanical stress in the piezoelectric layer caused by deformations of the membrane comprises depositing the piezoelectric layer on a surface of the second layer of material opposite to the first layer of material.

25. The method of claim 20, further comprising providing an oil film on walls of the hot and cold environments.

26. The method of claim 25, wherein exposing the membrane to a hot environment comprises exposing the membrane to a hot surface of an integrated circuit chip.

27. The method of claim 20, further comprising providing a thermally conductive paste on walls of the hot and cold environments.

28. The method of claim 20, wherein exposing the membrane to a hot environment comprises exposing the membrane to a hot surface of a car.

29. The method of claim 20, wherein exposing the membrane to a cold environment comprises exposing the membrane to ambient air.

30. A thermoelectric generator comprising:
a membrane maintained by lateral ends and capable of taking a first shape when the temperature of the membrane reaches a first threshold and capable of taking a second shape when the temperature of the membrane reaches a second threshold greater than the first threshold; and
means for converting deformations of the membrane into electricity,
wherein the membrane is capable of taking the first shape and/or the second shape as a result of thermal expansion and/or thermal compression of at least a portion of the membrane.

31. The thermoelectric generator of claim 30, wherein the means capable of converting deformations of the membrane into electricity comprises a region made of a piezoelectric material connected to output terminals of the generator.

* * * * *